(12) United States Patent
Maniwa

(10) Patent No.: US 6,922,104 B2
(45) Date of Patent: Jul. 26, 2005

(54) POWER AMPLIFIER DISTORTION COMPENSATION APPARATUS AND METHOD THEREOF

(75) Inventor: Toru Maniwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 9 days.

(21) Appl. No.: 10/610,732

(22) Filed: Jun. 30, 2003

(65) Prior Publication Data

US 2004/0004516 A1 Jan. 8, 2004

(30) Foreign Application Priority Data

Jul. 4, 2002 (JP) .................................. 2002-196117

(51) Int. Cl.[7] ................................................. H03F 1/26
(52) U.S. Cl. ..................... 330/149; 375/296; 455/126
(58) Field of Search ............................... 330/136, 149; 375/296, 297; 455/63, 126

(56) References Cited

U.S. PATENT DOCUMENTS

| | | | | |
|---|---|---|---|---|
| 5,699,383 A | * | 12/1997 | Ichiyoshi | 330/149 |
| 5,892,397 A | * | 4/1999 | Belcher et al. | 330/149 |
| 6,275,685 B1 | * | 8/2001 | Wessel et al. | 455/126 |
| 6,281,936 B1 | | 8/2001 | Twitchell et al. | |
| 6,335,767 B1 | | 1/2002 | Twitchell et al. | |

FOREIGN PATENT DOCUMENTS

| | | |
|---|---|---|
| JP | 54-140856 | 11/1979 |
| JP | 9-130439 | 5/1997 |
| WO | WO 01/08320 A1 | 2/2001 |

OTHER PUBLICATIONS

European Search Report dated Aug. 17, 2004.

* cited by examiner

Primary Examiner—Khanh V. Nguyen
(74) Attorney, Agent, or Firm—Katten Muchin Zavis Rosenman (57) ABSTRACT

A distortion compensation apparatus and method for a power amplifier enable accurate distortion compensation, even if frequency amplitude deviation and group delay error are present in the power amplifier. A reverse distortion coefficient is read from a reverse distortion coefficient table. A distortion compensation process is performed on an incoming signal using the read reverse distortion coefficient. The distortion compensated signal is amplified and transmitted by the power amplifier, and the reverse distortion coefficient table is updated based on the incoming signal before distortion compensation, and the output signal of the power amplifier. The relation between the phase of the time difference value and the reverse distortion coefficient is obtained from the reverse distortion coefficient corresponding to a linear operation domain of the power amplifier. A frequency characteristic of a frequency characteristic compensation filter, to which the distortion compensated signal is supplied, is set such that inclination of the phase of the reverse distortion coefficient becomes small, thereby accurate distortion compensation can be performed even if frequency amplitude deviation is present in the power amplifier.

7 Claims, 8 Drawing Sheets

POWER AMPLIFIER DISTORTION COMPENSATION APPARATUS AND METHOD THEREOF

BACKGROUND OF THE INVENTION

1. Field of the Invention

The present invention generally relates to an apparatus and a method of distortion compensation for a power amplifier, and especially relates to the apparatus and the method of distortion compensation for the power amplifier used by radio base stations of a cellular phone system, digital broadcasting, and the like.

2. Description of the Related Art

As a technique for reducing distortion of a transmission power amplifier used by radio base stations of a cellular phone system, digital broadcasting, and the like, a pre-distorter has been used. For example, a pre-distorter proposed by JP,54-140856,A suppresses distortion of a power amplifier by applying a reverse distortion coefficient to the power amplifier according to envelope amplitude of a source signal to be transmitted. Characteristics of the reverse distortion are determined by obtaining a difference between the source signal to be transmitted and the signal output by the power amplifier, and are determined such that the difference becomes zero, using a method such as LMS (Least Mean Square).

Figure 1:
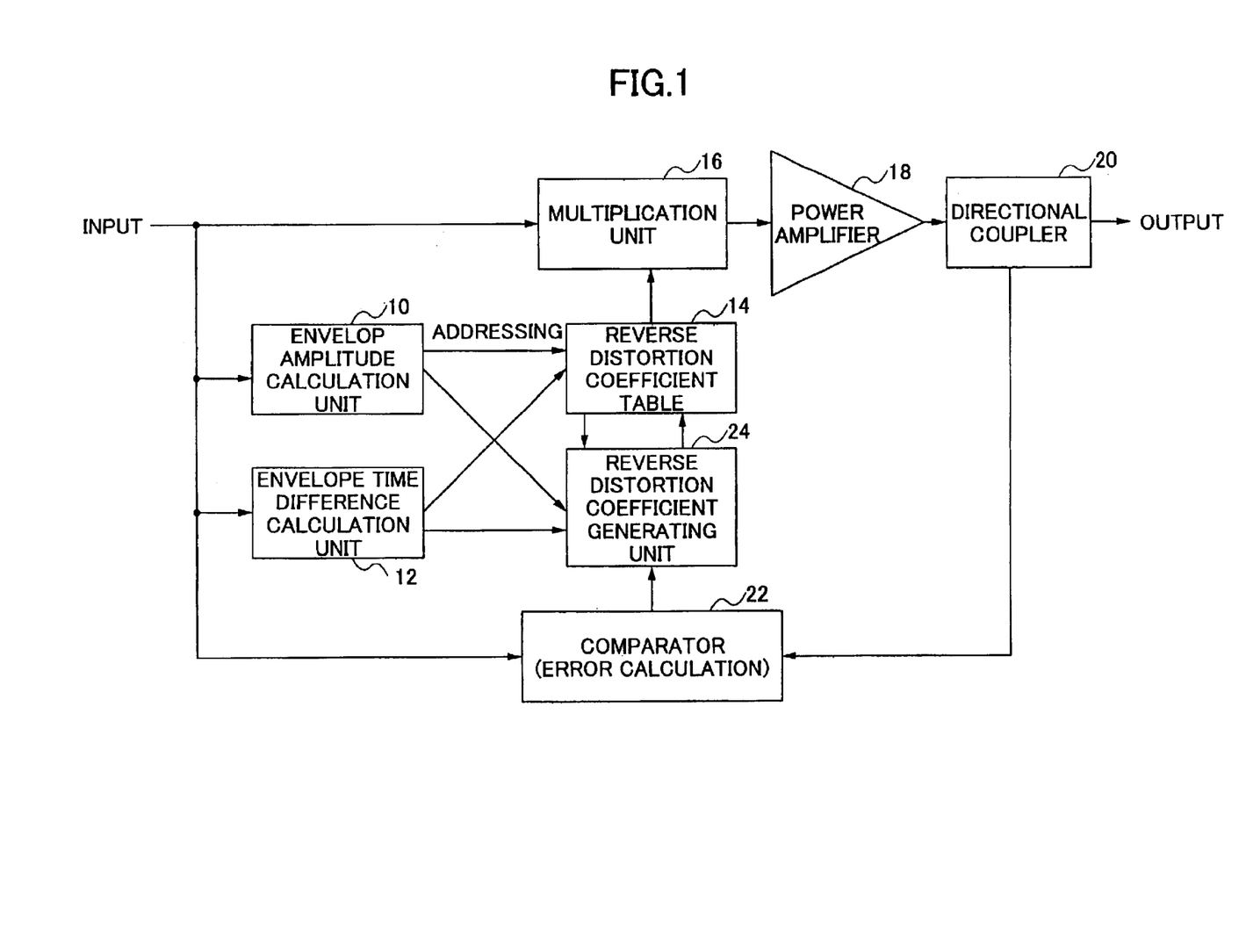
FIG. 1 is a block diagram of an example of a distortion compensation apparatus of a conventional power amplifier.

A pre-distorter proposed by Japanese patent application 2001-512717 includes, as shown in FIG. 1, an envelope amplitude calculation unit 10 for acquiring envelope amplitude of an incoming signal, an envelope time difference calculation unit 12 for calculating time difference of the envelope amplitude of the incoming signal, a reverse distortion coefficient table 14 that is searched to obtain a reverse distortion coefficient corresponding to the envelope amplitude and the time difference. Further, complex multiplication of the incoming signal by the reverse distortion coefficient is performed by a multiplication unit 16, the result of which is amplified by a power amplifier 18, and an output signal is transmitted.

Further, a part of the output signal of the power amplifier 18 is branched by a directional coupler 20, and is compared with the incoming signal before distortion compensation by a comparator 22. A coefficient generating unit 24 generates a reverse distortion coefficient, and updates the reverse distortion coefficient stored in the reverse distortion coefficient table 14 from the comparison result of the comparator 22 such that the difference between the incoming signal before distortion compensation and the output signal becomes zero.

The pre-distorter, shown in FIG. 1, may provide satisfactory results where there are no linear errors, such as frequency amplitude deviation (linear variation of amplitude depending on frequency), group delay error (linear variation of signal delay amounts depending on frequency), and the like in the power amplifier 18. However, if there is a linear error, such as described above, in the power amplifier 18, a problem arises in that the pre-distorter that determines the reverse distortion coefficient by comparing the output signal of the power amplifier with the input signal cannot provide an accurate reverse distortion coefficient, and therefore, does not provide accurate compensation of the distortion.

SUMMARY OF THE INVENTION

It is a general object of the present invention to provide an apparatus and a method that substantially obviate one or more of the problems caused by the limitations and disadvantages of the related art.

Specifically, the present invention aims at providing a distortion compensation apparatus that enables a power amplifier to provide accurate distortion compensation, even when the power amplifier has frequency amplitude deviation and group delay error characteristics, and a method thereof.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by an apparatus and a method particularly pointed out in the specification in such full, clear, concise, and exact terms as to enable a person having ordinary skill in the art to practice the invention.

To achieve these and other advantages and in accordance with the purpose of the present invention, as embodied and broadly described herein, the invention provides as follows.

The present invention provides means for controlling frequency characteristics of a frequency characteristic compensation filter, to which a distortion compensated signal is supplied, such that inclination of a phase of a reverse distortion coefficient becomes small by obtaining phase relations between a time difference value and a reverse distortion coefficient, where the reverse distortion coefficient is that of a linear operation domain of a power amplifier. In this manner, accurate distortion compensation can be performed even if frequency amplitude deviation is present in the power amplifier.

The present invention further provides means for controlling delay characteristics of delay means, to which the distortion compensated signal is supplied, such that inclination of amplitude of the reverse distortion coefficient becomes small by obtaining amplitude relations between the time difference value and the reverse distortion coefficient, where the reverse distortion coefficient is that of the linear operation domain of the power amplifier. In this manner, accurate distortion compensation can be performed even if a group delay error is present in the power amplifier.

The present invention further provides:

linear state memory means for storing values of amplitude and phase of the reverse distortion characteristics, the values being obtained beforehand by replacing the power amplifier with a line without linear distortion, and by switching the frequency characteristics of the frequency characteristic compensation filter, and frequency characteristic control means for controlling the frequency characteristics of the frequency characteristic compensation filter so that inclination of the phase of the reverse distortion coefficient becomes small, when the power amplifier is connected, by referring to the linear state memory means, using the inclination of the phase of the reverse distortion coefficient as a key, where phase relations between the time difference value and the reverse distortion coefficient are obtained from the reverse distortion coefficient corresponding to a linear operation domain of the power amplifier. In this manner, the control of the frequency characteristics of the frequency characteristic compensation filter can be immediately performed.

DESCRIPTION OF THE PREFERRED EMBODIMENTS

In the following, embodiments of the present invention will be described with reference to the accompanying drawings.

Figure 2:
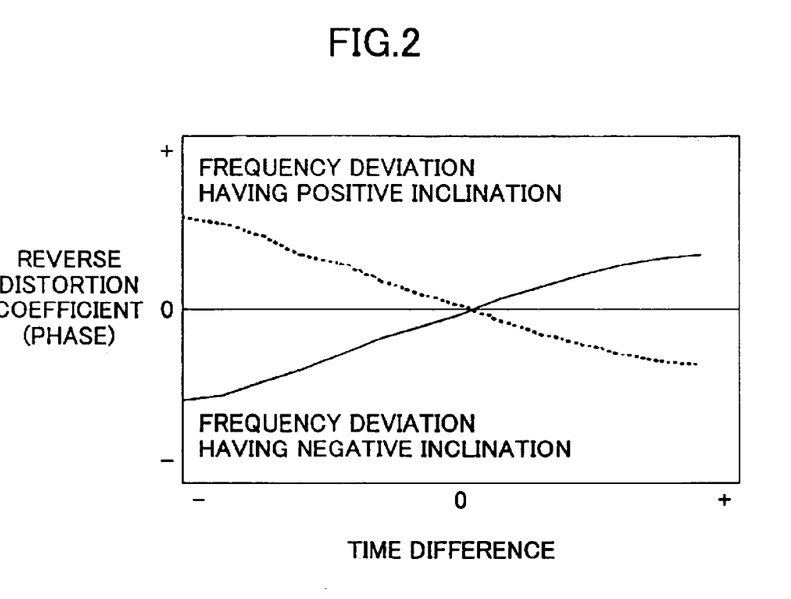
FIG. 2 shows phases of reverse distortion characteristics when a frequency amplitude deviation is present in a power amplifier, the horizontal axis representing a time difference value.

First, the principle of the present invention is explained. When a frequency amplitude deviation is present in a power amplifier, phases of reverse distortion characteristic are as shown by FIG. 2, where the horizontal axis represents a time difference value. That is, the phases of the reverse distortion characteristics decrease as the time difference value increases when the frequency amplitude deviation is positive as shown by the dotted line; and, conversely, when the frequency amplitude deviation is negative, the phases of the reverse distortion characteristics increase as the time difference value increases as shown by the solid line.

Figure 3:
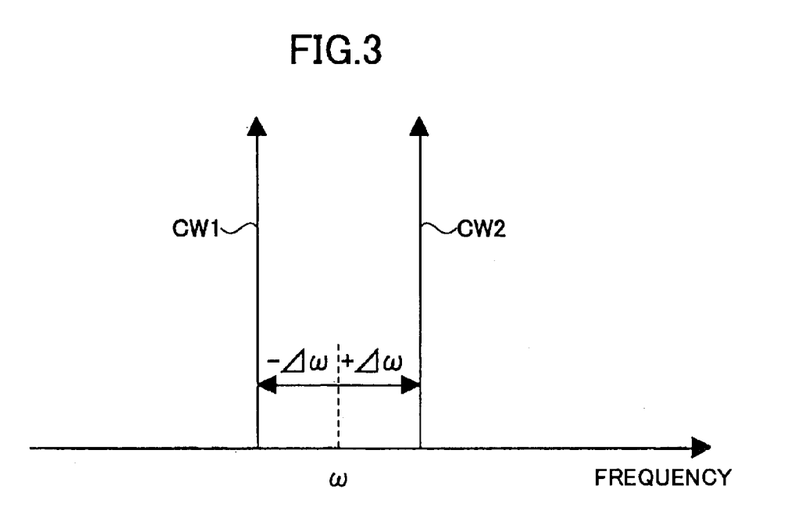
FIG. 3 is for explaining the principle of the present invention.

This matter is further explained by considering amplifying two continuous wave CW signals CW1 and CW2. The two CW signals as shown in FIG. 3 can be expressed as cos(Δωt)cos(ωt). If it is expressed in an IQ complex plane that is often used by digital modulation schemes, behavior of the CW signals on the IQ plane appears as a straight line on the I axis, when there is no frequency amplitude deviation; conversely, when there is frequency amplitude deviation, the behavior shifts from the straight line on the I axis, and will appear as an ellipse.

Figure 4:
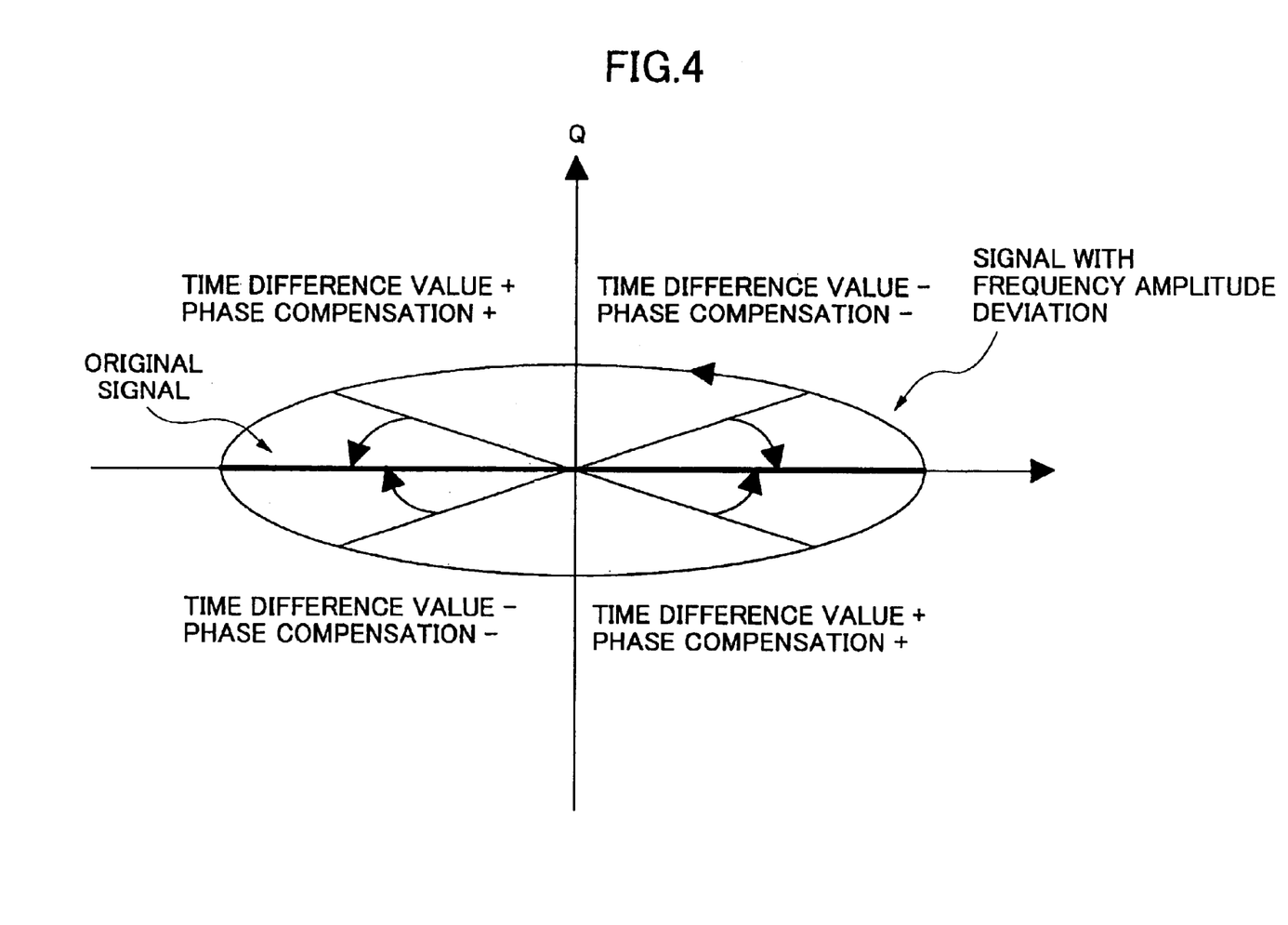
FIG. 4 is for explaining the principle of the present invention.

The phase of the reverse distortion coefficient is explained with reference to FIG. 4. Where a frequency amplitude deviation is present in the power amplifier in the case of an orthogonal modulation-demodulation method defined as I(t) cos(ωt)−Q(t)sin(ωt), and where a frequency amplitude deviation is such that the amplitude of the higher frequency CW2 becomes greater than the amplitude of the lower frequency CW1, the CW signal is expressed by A cos(Δωt)+ jB sin(Δωt), where A and B are positive numbers. For this reason, it appears as a clockwise ellipse. If, conversely, the frequency amplitude deviation is such that the amplitude of the higher frequency CW2 becomes smaller than the amplitude of the lower frequency CW1, the ellipse becomes counterclockwise.

For example, in the case of the counterclockwise ellipse, the phase becomes positive (+) where the magnitude of the envelope (Q axis ingredient) goes up from zero in the first quadrant. In order to compensate the positive phase, the value of the phase (phase compensation) of the reverse distortion characteristic is made negative (−) realizing the compensation with least phase deviation. In the second quadrant, the magnitude of the envelope falls, with the phase being positive. However, the phase compensation is set to positive, since the Q axis ingredient is made closer to zero by changing the phase to positive. Similarly, in the phase compensation in the third quadrant, the phase compensation is set to negative; and the phase compensation is set to positive in the fourth quadrant.

Therefore, when inclination of the frequency amplitude deviation is negative to the frequency (counterclockwise in the case of the two wave CW signals), the phase value of the reverse distortion coefficient has a positive inclination to the time difference value of the envelope amplitude of the signal. To the contrary, when inclination of the frequency amplitude deviation is positive to the frequency, the phase value of the reverse distortion coefficient has a negative inclination to the time difference value of the envelope amplitude of the signal. That is, the characteristics become as shown by FIG. 2.

Here, the frequency amplitude deviation is considered to be almost linear for an envelope amplitude smaller than −20 dB of the maximum amplitude. For this reason, the frequency amplitude deviation of a power amplifier can be compensated for by switching the frequency characteristics of a frequency characteristic compensation filter such that the inclination of the phase of the characteristics shown in FIG. 2 may become zero, referring to the phase relations of the reverse distortion coefficient of the low amplitude region.

Figure 5:
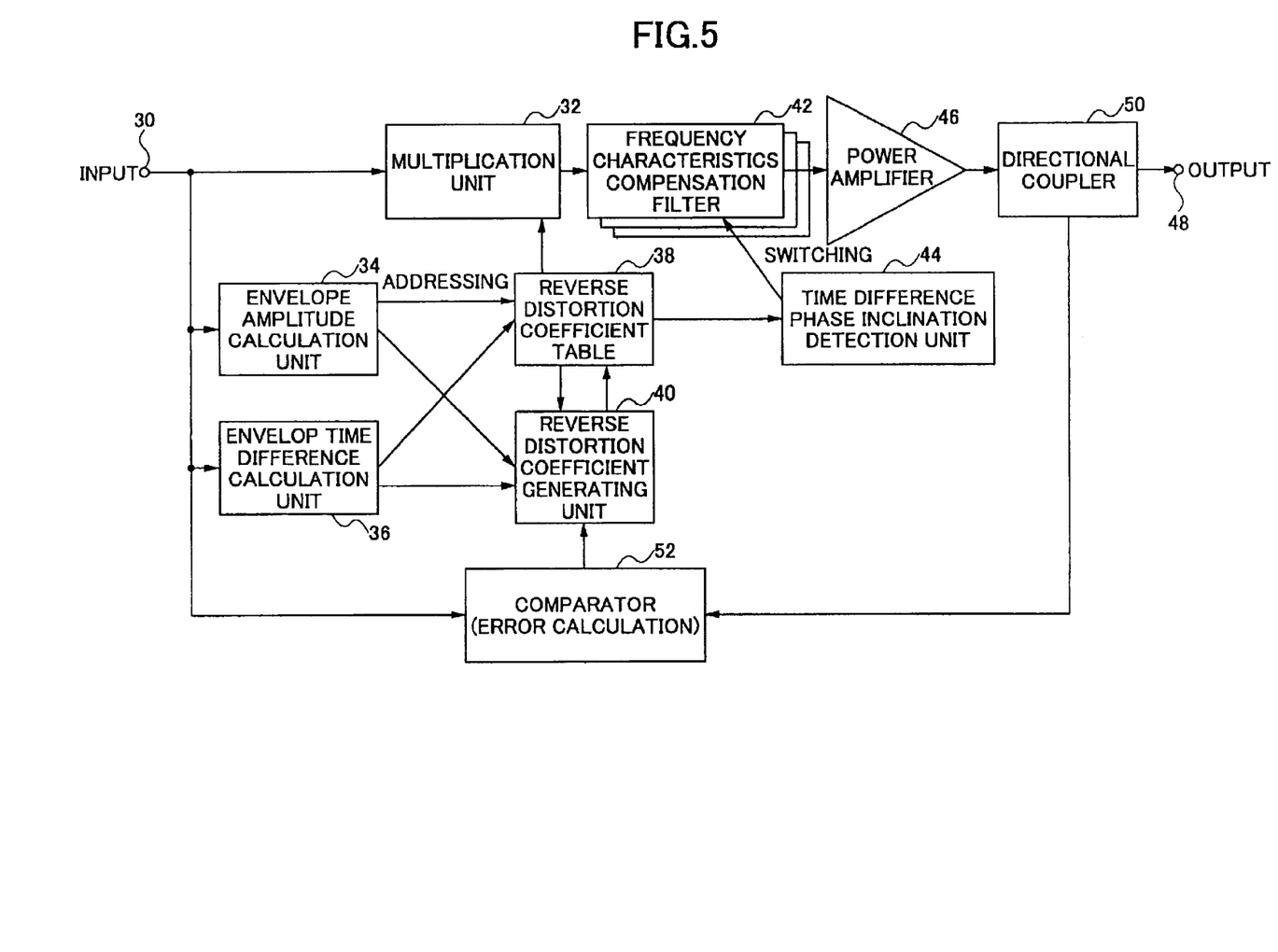
FIG. 5 is a block diagram of the distortion compensation apparatus of the power amplifier according to the first embodiment of the present invention.

FIG. 5 is a block diagram of the distortion compensation apparatus of the power amplifier according to the first embodiment of the present invention. In reference to FIG. 5, a signal modulated by an orthogonal signal (consisting of an I signal and a Q signal) is supplied to a terminal 30 as an incoming signal, which is distributed to a multiplication circuit 32, an envelope amplitude calculation unit 34, and an envelope time difference calculation unit 36. The envelope amplitude calculation unit 34 calculates envelope amplitude p(t) of the incoming signal, which is then supplied to a reverse distortion coefficient table 38 and a coefficient generating unit 40. The envelope time difference calculation unit 36 calculates a time difference Δp, which is equal to p(t)−p(t−1), of the envelope amplitude, which is supplied to the reverse distortion coefficient table 38 and the coefficient generating unit 40.

The reverse distortion coefficient table 38 stores combinations of the envelope amplitude p(t) and the time difference Δp as complex values of the reverse distortion coefficient h(p(t), Δp). A reverse distortion coefficient is read from the reverse distortion coefficient table 38 according to the envelop amplitude provided by the envelope amplitude calculation unit 34 and the envelop time difference provided by the envelope time difference calculation unit 36, and supplied to the multiplication circuit 32.

The multiplication circuit 32 performs a complex number multiplication of the incoming signal by the reverse distortion coefficient for distortion compensation, and a frequency characteristic compensation filter 42 performs frequency compensation. The frequency characteristic compensation filter 42 switches frequency compensation characteristics under control of a difference value phase inclination detection unit 44 that is explained later. An output signal of the frequency characteristic compensation filter 42 is supplied to a power amplifier 46 in order to be amplified, and transmitted from a transmission antenna via a terminal 48.

A directional coupler 50 branches and supplies a part of the output signal of the power amplifier 46 to a comparator 52. The comparator 52 compares the output signal of the power amplifier 46 with the incoming signal before distortion compensation, and supplies a comparison result to the coefficient generating unit 40. The coefficient generating unit 40 generates a reverse distortion coefficient such that the difference between the incoming signal before distortion compensation and the output signal becomes zero using the comparison result from the comparator 52, and updates the reverse distortion coefficient of the reverse distortion coefficient table 38.

The difference value phase inclination detection unit 44 reads the reverse distortion coefficient of a low amplitude portion, i.e., −20 dB or less of the maximum amplitude from the reverse distortion coefficient table 38, obtains the phase of the reverse distortion coefficient by dividing the value of the imaginary part by the value of the real part of the reverse distortion coefficient, and obtains the characteristics as shown in FIG. 2 from the phase of the time difference value and the reverse distortion coefficient. Here, the frequency characteristics of the frequency characteristic compensation filter 42 are switched so that the inclination of the phase of the reverse distortion coefficient becomes zero. The switching of the frequency characteristic compensation filter 42 is divided into steps so that the inclination of the phase gradually approaches 0.

In this manner, even if frequency amplitude deviation is present in the power amplifier 46, an accurate reverse distortion coefficient can be generated, and accurate distortion compensation can be performed.

Here, the switching of the frequency characteristics can be carried out by providing variable tap coefficients, when the frequency characteristic compensation filter 42 is a digital filter. Otherwise, the switching can also be carried out by providing a plurality of filters having different frequency characteristics, and selecting one of the filters according to desired frequency characteristics. Further, the frequency characteristic compensation filter 42 may be provided between the directional coupler 50 and the comparator 52.

Figure 6:
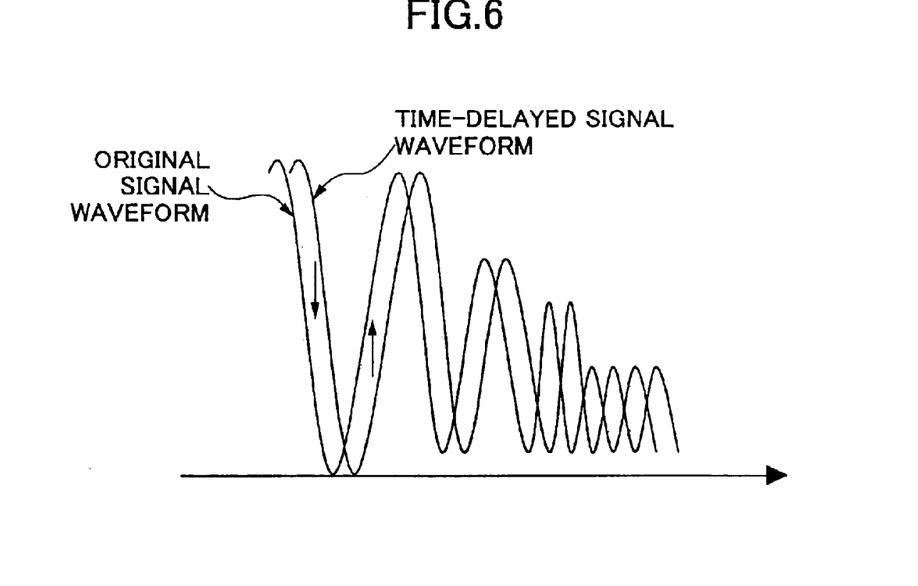
FIG. 6 is for explaining changes of a reverse distortion coefficient when a group delay error is present.

Next, linear distortion also occurs when there is a group delay error due to a signal delay amount varying depending on frequency, the signal delay being between the incoming signal and the output signal of the power amplifier, which are supplied to the comparator 52. With reference to FIG. 6, an explanation is presented as to how the reverse distortion coefficient varies when there is a group delay error.

When a signal from the power amplifier is delayed, the magnitude of the signal, observed at the same moment, is observed small if the time difference of the envelope amplitude is positive, and the amplitude ingredient of the reverse distortion coefficient becomes great; and if the time difference is negative, the magnitude of the signal, observed at the same moment, is observed great, and the amplitude ingredient of the reverse distortion coefficient becomes small.

Figure 7:
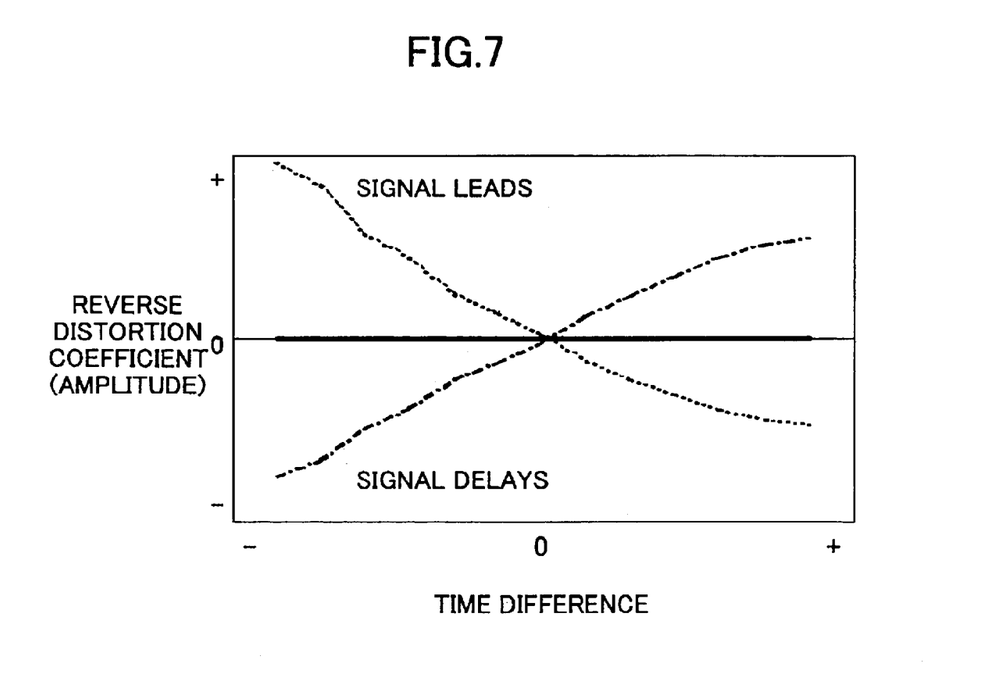
FIG. 7 shows amplitude of the reverse distortion characteristics when a group delay error is present in the power amplifier, the horizontal axis representing a time difference value.

As shown in FIG. 7, wherein the horizontal axis represents the time difference value of the envelope amplitude, in the case that a signal leads (rather than delays), inclination of the amplitude of the reverse distortion coefficient becomes negative to the time difference value (as shown by the dotted line); and in the case that the signal delays, the inclination of the amplitude of the reverse distortion coefficient becomes positive (as shown by the dashed line). The group delay error of the power amplifier can be compensated for by switching a delay element or a delay filter so that the inclination becomes zero.

Figure 8:
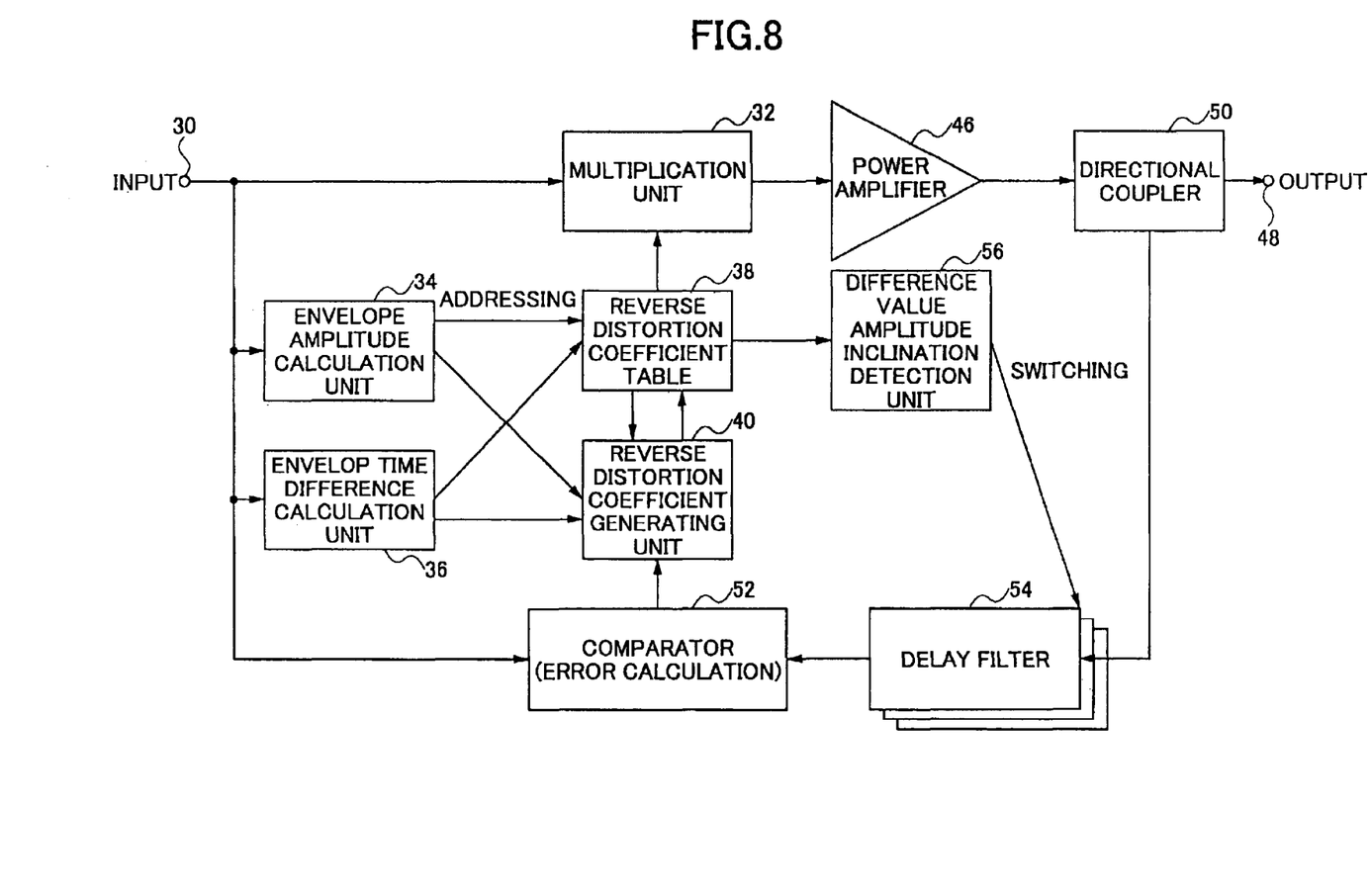
FIG. 8 is a block diagram of the distortion compensation apparatus of the power amplifier according to the second embodiment of the present invention.

FIG. 8 is a block diagram of the distortion compensation apparatus of the power amplifier according to the second embodiment of the present invention. The same reference marks are given to the portions the same as FIG. 5. In FIG. 8, the signal modulated by an orthogonal signal, consisting of an I signal and a Q signal, is supplied to the terminal 30 as an incoming signal that is distributed to the multiplication circuit 32, the envelope amplitude calculation unit 34, and the envelope time difference calculation unit 36. The envelope amplitude calculation unit 34 calculates envelope amplitude p(t) of the incoming signal, and supplies the computed envelope amplitude p(t) to the reverse distortion coefficient table 38 and the coefficient generating unit 40. The envelope time difference calculation unit 36 calculates a time difference Δp, which is equal to p(t)−p(t−1), of the envelope amplitude, and supplies the time difference to the reverse distortion coefficient table 38 and the coefficient generating unit 40.

The reverse distortion coefficient table 38 stores combinations of the envelope amplitude p(t) and the time difference Δp as complex values of the reverse distortion coefficient h(p(t), Δp). A reverse distortion coefficient is read from the reverse distortion coefficient table 38 according to the envelop amplitude provided by the envelope amplitude calculation unit 34 and the envelop time difference provided by the envelope time difference calculation unit 36, and supplied to the multiplication circuit 32.

The multiplication circuit 32 performs complex multiplication of the incoming signal by the reverse distortion coefficient, and performs distortion compensation, the output of which is amplified by the power, amplifier 46 for transmission, and the signal is supplied to the terminal 48, then to a transmitting antenna.

The directional coupler 50 branches and supplies a part of the output signal from the power amplifier 46 to a delay filter 54. A value amplitude inclination detection unit 56 controls switching of delay characteristics of the delay filter 54 as explained later.

The output signal of the delay filter 54 is supplied to the comparator 52. The comparator 52 compares the output signal of the power,amplifier 46 with the incoming signal before distortion compensation, and supplies a comparison result to the coefficient generating unit 40. The coefficient generating unit 40 generates a reverse distortion coefficient that makes the difference between the incoming signal before distortion compensation and the output signal zero from the comparison result of the comparator 22, and updates the reverse distortion coefficient of the reverse distortion coefficient table 38.

The difference value amplitude inclination detection unit 56 reads from the reverse distortion coefficient table 38 the reverse distortion coefficient of a low amplitude portion, i.e., −20 dB or less than the maximum amplitude, and obtains characteristics as shown in FIG. 7 from the time difference value and the amplitude of the reverse distortion coefficient. Further, the difference value amplitude inclination detection unit 56 controls switching of the delay characteristics of the delay filter 54 so that the inclination of the amplitude in the characteristic obtained becomes zero. The switching of the delay filter 54 is performed in steps so that the inclination of the amplitude gradually approach zero.

In this manner, an accurate reverse distortion coefficient can be generated, and accurate distortion compensation can be performed even if a group delay error is present in the power amplifier 46. Here, the delay filter 54 may be provided before the power amplifier 46, and the delay filter 54 may be composed of delay elements having different delay times, which are switched.

Figure 9:
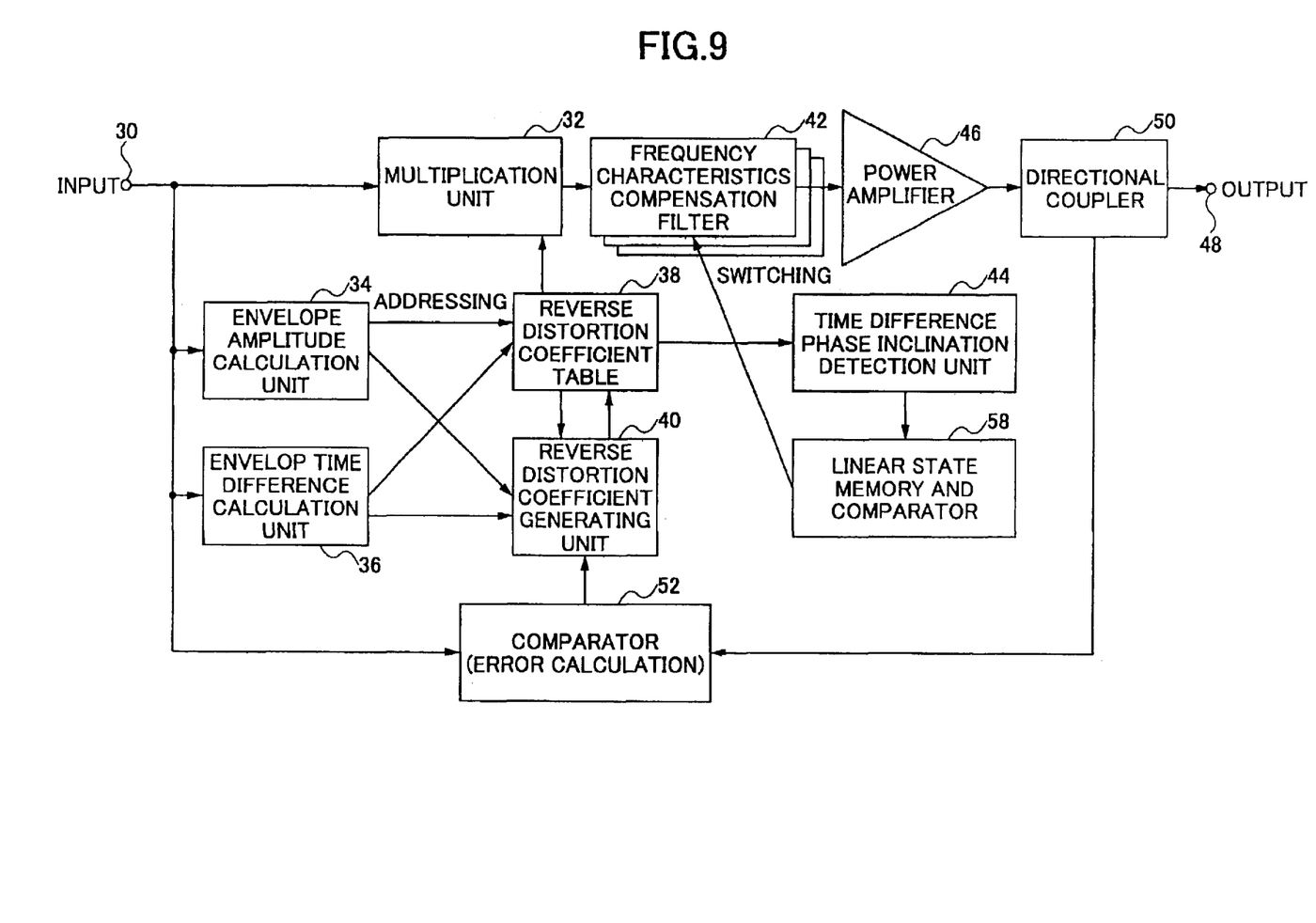
FIG. 9 is a block diagram of the distortion compensation apparatus of the power amplifier according to the third embodiment of the present invention.

FIG. 9 shows a block diagram of the distortion compensation apparatus of the power amplifier according to the third embodiment of the present invention. The same reference marks are given to the same portions as in FIG. 5 and FIG. 8. In FIG. 9, a signal modulated by an orthogonal signal, consisting of an I signal and a Q signal, is supplied to the terminal 30 as an incoming signal, which is provided to the multiplication circuit 32, the envelope amplitude calculation unit 34, and the envelope time difference calculation unit 36. The envelope amplitude calculation unit 34 calculates envelope amplitude P(t) of the incoming signal, and supplies it to the reverse distortion coefficient table 38 and the coefficient generating unit 40. The envelope time difference calculation unit 36 calculates a time difference Δp, which is equal to p(t)−p(t−1), of the envelope amplitude, and supplies it to the reverse distortion coefficient table 38 and the coefficient generating unit 40.

The reverse distortion coefficient table 38 stores combinations of the envelope amplitude p(t) and the time difference Δp as complex values of the reverse distortion coefficient h(p(t), Δp). A reverse distortion coefficient is read from the reverse distortion coefficient table 38 according to the envelope amplitude provided by the envelope amplitude calculation unit 34 and the time difference provided by the envelope time difference calculation unit 36, and is provided to the multiplication circuit 32.

The multiplication circuit 32 performs complex multiplication of the incoming signal by the reverse distortion coefficient, and performs distortion compensation, and the frequency characteristic compensation filter 42 performs frequency compensation. The frequency characteristic compensation filter 42 selects an appropriate frequency compensation characteristic by control of the difference value phase inclination detection unit 44 that is described later. An output signal from the frequency characteristic compensation filter 42 is supplied to the power amplifier 46 for amplification, and then provided to the terminal 48 for transmission from the antenna.

The directional coupler 50 branches and supplies a part of the output signal of the power amplifier 46 to the comparator 52. The comparator 52 compares the output signal of the power amplifier 46 with the incoming signal before distortion compensation, and supplies a comparison result to the coefficient generating unit 40. The coefficient generating unit 40 generates a reverse distortion coefficient such that the difference between the incoming signal before distortion compensation and the output signal becomes zero from the comparison result provided by the comparator 22, and updates the reverse distortion coefficient of the reverse distortion coefficient table 38.

The difference value phase inclination detection unit 44 reads a reverse distortion coefficient of the low amplitude portion, i.e., −20 dB or less than the maximum amplitude, from the reverse distortion coefficient table 38, obtains a phase using the values of the imaginary part and the real part of the reverse distortion coefficient, obtains the time difference phase characteristic as shown in FIG. 2 from the time difference value and the phase, and supplies it to a linear state memory and comparator 58.

The linear state memory and comparator 58 stores beforehand values of the time delay deviation and the frequency amplitude deviation in relation to target values of characteristics to be corrected, and the amplitude and phase of the reverse distortion characteristics. The values are obtained by replacing the power amplifier 46 with a line without linear distortion, and varying the tap coefficient of the frequency characteristic compensation filter 42. In actual operations, i.e., the power amplifier being put back in place, the inclination of the time difference phase characteristic supplied from the difference value phase inclination detection unit 44 is compared with the amplitude and the phase of the reverse distortion characteristics that are stored, and an appropriate filter characteristic of the frequency characteristic compensation filter 42 is selected. In this manner, the frequency characteristics of the frequency characteristic compensation filter 42 can be immediately switched.

In addition, the same linear state memory and comparison unit 58 can be provided to the second embodiment shown by FIG. 8 such that, in actual operations, the inclination of the time difference amplitude characteristic supplied from the difference value amplitude inclination detection unit 56 is compared with the amplitude and the phase of the reverse distortion characteristics that are stored, and an appropriate filter characteristic is selected such that the delay characteristic of the delay filter 54 can immediately be switched.

In addition, when there are both a frequency amplitude deviation and a group delay error, the structure is such that FIG. 5 and FIG. 8 are combined, wherein the difference value phase inclination detection unit 44 controls the characteristics of the frequency characteristic compensation filter 42 in a first step; the value amplitude inclination detection unit 56 controls switching of the delay characteristic of the delay filter 54 in a second step; and the first step and the second step are alternately performed such that an optimum point is obtained.

As described above, according to the present invention, accurate distortion compensation can be performed even if frequency amplitude deviation is present in the power amplifier.

According to the present invention, accurate distortion compensation can be performed even if group delay error is present in the power amplifier.

According to the present invention, the frequency characteristics of a frequency characteristic compensation filter are immediately controllable.

Here, the difference value phase inclination detection unit 44 corresponds to frequency characteristic control means; the delay filter 54 correspond to delay means; the difference the value amplitude inclination detection unit 56 corresponds to delay characteristic control means; and the linear state memory and comparison unit 58 corresponds to linear state memory means and frequency characteristic control means, respectively, described in the claims that follow.

Figure 10:
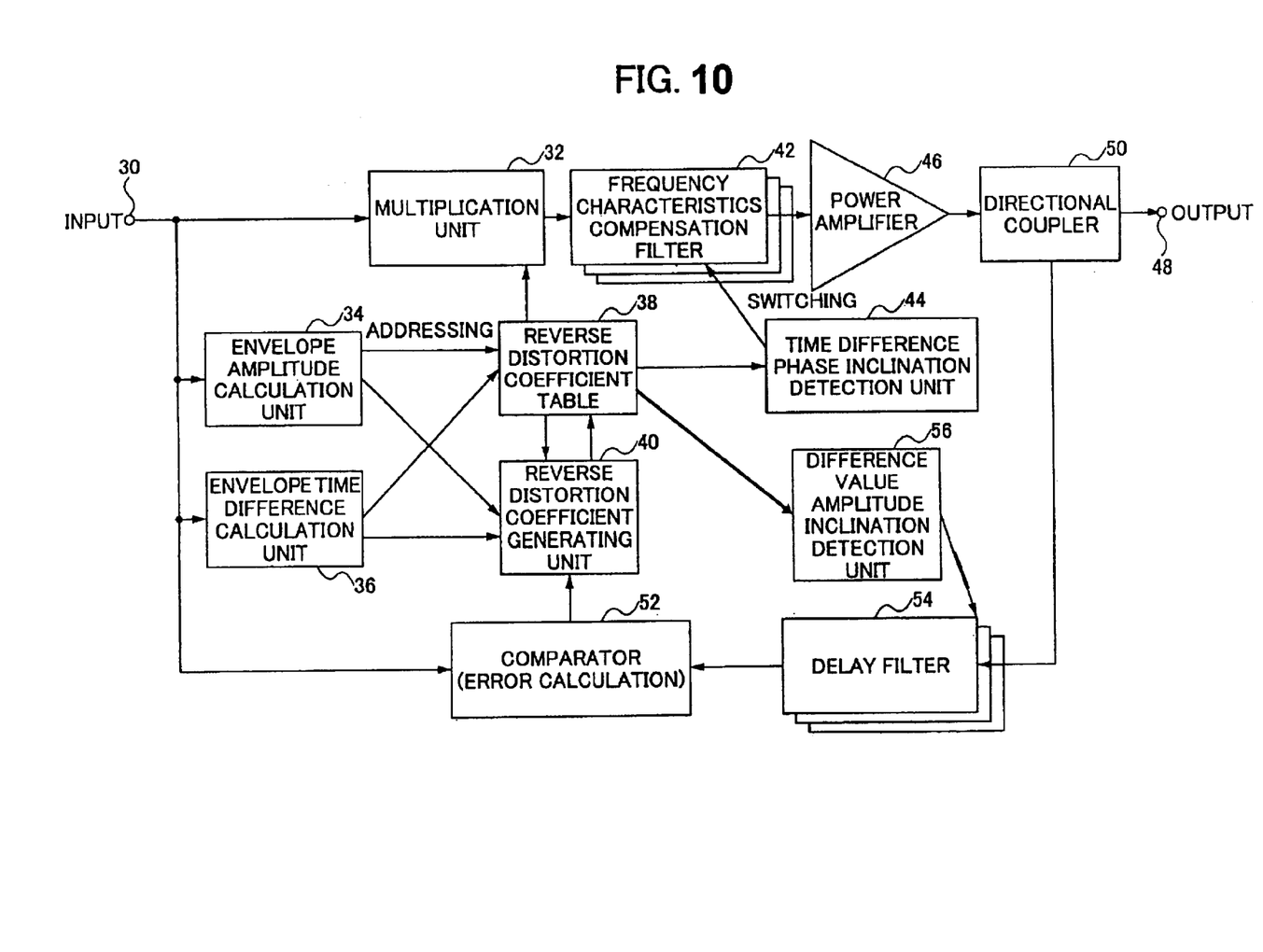
FIG. 10 is a block diagram of the distortion compensation apparatus of the power amplifier according to the fourth embodiment of the present invention.

FIG. 10 shows a block diagram of the distortion compensation apparatus of the power amplifier according to the fourth embodiment of the present invention. The same reference marks are given to the same portions as in FIG. 5 and FIG. 8.

In reference to FIG. 10, a signal modulated by an orthogonal signal (consisting of an I signal and a Q signal) is supplied to a terminal 30 as an incoming signal, which is distributed to a multiplication circuit 32, an envelope amplitude calculation unit 34, and an envelope time difference calculation unit 36. The envelope amplitude calculation unit 34 calculates envelope amplitude p(t) of the incoming signal, which is then supplied to a reverse distortion coefficient table 38 and a coefficient generating unit 40. The envelope time difference calculation unit 36 calculates a time difference Δp, which is equal to p(t)−p(t−1), of the envelope amplitude, which is supplied to the reverse distortion coefficient table 38 and the coefficient generating unit 40.

The reverse distortion coefficient table 38 stores combinations of the envelope amplitude p(t) and the time difference Δp as complex values of the reverse distortion coefficient h(p(t), Δp). A reverse distortion coefficient is read from the reverse distortion coefficient table 38 according to the envelop amplitude provided by the envelope amplitude calculation unit 34 and the envelop time difference provided by the envelope time difference calculation unit 36, and supplied to the multiplication circuit 32.

The multiplication circuit 32 performs a complex number multiplication of the incoming signal by the reverse distortion coefficient for distortion compensation, and a frequency characteristic compensation filter 42 performs frequency compensation. The frequency characteristic compensation filter 42 switches frequency compensation characteristics under control of a difference value phase inclination detection unit 44 that is explained later. An output signal of the frequency characteristic compensation filter 42 is supplied to a power amplifier 46 in order to be amplified, and transmitted from a transmission antenna via a terminal 48.

The directional coupler 50 branches and supplies a part of the output signal from the power amplifier 46 to a delay filter 54. A value amplitude inclination detection unit 56 controls switching of delay characteristics of the delay filter 54 as explained earlier with reference to FIG. 8.

The output signal of the delay filter 54 is supplied to the comparator 52. The comparator 52 compares the output signal of the power amplifier 46 with the incoming signal before distortion compensation, and supplies a comparison result to the coefficient generating unit 40. The coefficient generating unit 40 generates a reverse distortion coefficient that makes the difference between the incoming signal before distortion compensation and the output signal zero from the comparison result of the comparator 52, and updates the reverse distortion coefficient of the reverse distortion coefficient table 38.

As earlier explained with reference to FIG. 5, the difference value phase inclination detection unit 44 reads the reverse distortion coefficient of a low amplitude portion, i.e., −20 dB or less of the maximum amplitude from the reverse distortion coefficient table 38, obtains the phase of the reverse distortion coefficient by dividing the value of the imaginary part by the value of the real part of the reverse distortion coefficient, and obtains the characteristics as shown in FIG. 2 from the phase of the time difference value and the reverse distortion coefficient.

Further, the present invention is not limited to these embodiments, but various variations and modifications may be made without departing from the scope of the present invention.

The present application is based on Japanese priority application No. 2002-196117 filed on Jul. 4, 2002 with the Japanese Patent Office, the entire contents of which are hereby incorporated by reference.

What is claimed is:

1. A distortion compensating method for a power amplifier, wherein a reverse coefficient table stores a plurality of reverse distortion coefficients for compensating for distortion generated by the power amplifier, a reverse distortion coefficient corresponding to envelope amplitude and a time difference of the envelope amplitude of an incoming signal is read from the reverse distortion coefficient table, a distortion compensation process is performed on the incoming signal using the read reverse distortion coefficient, the distortion compensation processed signal is amplified and transmitted by the power amplifier, and the reverse distortion coefficient table is updated based on the incoming signal before distortion compensation and the output signal of the power amplifier, comprising obtaining phase relations between the time difference value and the reverse distortion coefficient relative to the reverse distortion coefficient corresponding to a linear operation domain of the power amplifier, and adjusting frequency characteristics of a frequency characteristic compensation filter to which the distortion compensated signal is supplied such that inclination of the phase of the reverse distortion coefficient becomes small.

2. A distortion compensating method for a power amplifier, wherein a reverse coefficient table stores a plurality of reverse distortion coefficients for compensating for distortion generated by the power amplifier, a reverse distortion coefficient corresponding to envelope amplitude and a time difference of the envelope amplitude of an incoming signal is read from the reverse distortion coefficient table, a distortion compensation process is performed on the incoming signal using the read reverse distortion coefficient, the distortion compensation processed signal is amplified and transmitted by the power amplifier, and the reverse distortion coefficient table is updated based on the incoming signal before distortion compensation and the output signal of the power amplifier, comprising obtaining amplitude relations between the time difference value and the reverse distortion coefficient relative to the reverse distortion coefficient corresponding to a linear operation domain of the power amplifier, and adjusting delay characteristics of delay means to which the distortion compensated signal is supplied such that inclination of the amplitude of the reverse distortion coefficient becomes small.

3. A distortion compensating apparatus for a power amplifier, wherein a reverse coefficient table stores a plurality of reverse distortion coefficients for compensating for distortion generated by the power amplifier, a reverse distortion coefficient corresponding to envelope amplitude and a time difference of the envelope amplitude of an incoming signal is read from the reverse distortion coefficient table, a distortion compensation process is performed on the incoming signal using the read reverse distortion coefficient, the distortion compensation processed signal is amplified and transmitted by the power amplifier, and the reverse distortion coefficient table is updated based on the incoming signal before distortion compensation and the output signal of the power amplifier, comprising:

a frequency characteristic compensation filter, to which the distortion compensated signal is supplied, for setting up frequency characteristics, and frequency characteristic control means for obtaining phase relations between the time difference value and the reverse distortion coefficient from the reverse distortion coefficient corresponding to a linear operation domain of the power amplifier, and for controlling the frequency characteristics of the frequency characteristic compensation filter so that inclination of the phase of the reverse distortion coefficient becomes small.

4. The distortion compensation apparatus of the power amplifier as claimed in claim 3, further comprising:

linear state memory means for storing values of amplitude and phase of the reverse distortion characteristics, the values being obtained beforehand by replacing the power amplifier with a line without linear distortion, and by switching the frequency characteristics of the frequency characteristic compensation filter, wherein a frequency characteristic control means controls the frequency characteristics of the frequency characteristic compensation filter so that inclination of the phase of the reverse distortion coefficient becomes small, when the power amplifier is connected, by referring to the linear state memory means, using the inclination of the phase of the reverse distortion coefficient as a key, where phase relations between the time difference value and the reverse distortion coefficient are obtained from the reverse distortion coefficient corresponding to a linear operation domain of the power amplifier.

5. A distortion compensating apparatus for a power amplifier, wherein a reverse coefficient table stores a plurality of reverse distortion coefficients for compensating for distortion generated by the power amplifier, a reverse distortion coefficient corresponding to envelope amplitude and a time difference of the envelope amplitude of an incoming signal is read from the reverse distortion coefficient table, a distortion compensation process is performed on the incoming signal using the read reverse distortion coefficient, the distortion compensation processed signal is amplified and transmitted by the power amplifier, and the reverse distortion coefficient table is updated based on the incoming signal before distortion compensation and the output signal of the power amplifier, comprising:

delay means, to which the distortion compensated signal is supplied, for setting up delay characteristics, and delay characteristic control means for obtaining amplitude relations between the time difference value and the reverse distortion coefficient from the reverse distortion coefficient corresponding to a linear operation domain of the power amplifier, and for controlling the delay characteristics of the delay means so that inclination of the amplitude of the reverse distortion coefficient becomes small.

6. The distortion compensation apparatus of the power amplifier as claimed in claim 5, further comprising:

linear state memory means for storing values of amplitude and phase of the reverse distortion characteristics, the values being obtained beforehand by replacing the power amplifier with a line without linear distortion, and by switching a delay characteristic control means, wherein the delay characteristic control means controls the delay characteristics of the delay means so that inclination of the amplitude of the reverse distortion coefficient becomes small, when the power amplifier is connected, by referring to the linear state memory means, using the inclination of the amplitude of the reverse distortion coefficient as a key, where amplitude relations between the time difference value and the reverse distortion coefficient are obtained from the reverse distortion coefficient corresponding to a linear operation domain of the power amplifier.

7. The distortion compensation apparatus of the power amplifier as claimed in claim 3, further comprising:

delay means, to which the distortion compensated signal is supplied, for switching delay characteristics, and delay characteristic control means for controlling the delay characteristics of the delay means so that inclination of the amplitude of the reverse distortion coefficient becomes small, where amplitude relations of the amplitude of the time difference value and the reverse distortion coefficient are obtained from the reverse distortion coefficient corresponding to a linear operation domain of the power amplifier, said delay characteristic controlling of the delay characteristics of the delay means by the delay characteristic control means being performed alternately with the frequency characteristic controlling of the frequency characteristic compensation filter by the frequency characteristic control means.

* * * * *